(12) United States Patent
Iyoda

(10) Patent No.: US 10,132,461 B2
(45) Date of Patent: Nov. 20, 2018

(54) VEHICULAR LAMP

(71) Applicant: KOITO MANUFACTURING CO., LTD., Tokyo (JP)

(72) Inventor: Haruhiko Iyoda, Shizuoka (JP)

(73) Assignee: KOITO MANUFACTURING CO., LTD., Minato-ku, Tokyo (JP)

( * ) Notice: Subject to any disclaimer, the term of this patent is extended or adjusted under 35 U.S.C. 154(b) by 11 days.

(21) Appl. No.: 15/208,051

(22) Filed: Jul. 12, 2016

(65) Prior Publication Data

US 2017/0016587 A1    Jan. 19, 2017

(30) Foreign Application Priority Data

Jul. 15, 2015 (JP) ................................ 2015-141545

(51) Int. Cl.

| | |
|---|---|
| *F21V 21/00* | (2006.01) |
| *F21S 8/10* | (2006.01) |
| *F21S 41/155* | (2018.01) |
| *H05K 1/18* | (2006.01) |
| *F21S 41/19* | (2018.01) |
| *F21S 43/19* | (2018.01) |
| *F21S 43/145* | (2018.01) |

(52) U.S. Cl.
CPC ......... *F21S 48/1163* (2013.01); *F21S 41/155* (2018.01); *F21S 41/192* (2018.01); *F21S 43/145* (2018.01); *F21S 43/195* (2018.01); *H05K 1/189* (2013.01); *H05K 2201/10106* (2013.01); *H05K 2201/2054* (2013.01)

(58) Field of Classification Search
CPC .. F21Y 2101/02; F21S 40/215; F21S 48/1154

USPC ........................................ 362/545, 548, 549
See application file for complete search history.

(56) References Cited

U.S. PATENT DOCUMENTS

| | | | | |
|---|---|---|---|---|
| 4,775,964 | A * | 10/1988 | Alessio | .................. G04B 19/30 |
| | | | | 362/23.01 |
| 2005/0164470 | A1* | 7/2005 | Yamazaki | ......... G02F 1/133305 |
| | | | | 438/455 |
| 2006/0090384 | A1* | 5/2006 | Woodruff | .................. G09F 7/12 |
| | | | | 40/544 |
| 2006/0170839 | A1* | 8/2006 | Yamamoto | ........ G02F 1/133308 |
| | | | | 349/58 |
| 2014/0152178 | A1 | 6/2014 | Hodgson et al. | |

(Continued)

FOREIGN PATENT DOCUMENTS

| | | |
|---|---|---|
| CN | 103486554 A | 1/2014 |
| CN | 104302032 A | 1/2015 |
| DE | 202013105597 U1 | 5/2014 |

(Continued)

OTHER PUBLICATIONS

Communication dated May 4, 2017, issued by the French Patent Office in counterpart French Application No. 1656768.

(Continued)

*Primary Examiner* — Daniel St Cyr
(74) *Attorney, Agent, or Firm* — Sughrue Mion, PLLC

(57) ABSTRACT

A vehicular lamp includes a plurality of organic electroluminescence elements; and a flexible printed circuit board to which the plurality of organic electroluminescence elements are connected, the flexible printed circuit board having lines through which each of the organic electroluminescence elements is supplied with electric power independently.

7 Claims, 10 Drawing Sheets

(56) References Cited

U.S. PATENT DOCUMENTS

2015/0003083 A1 1/2015 Uehara
2015/0062946 A1 3/2015 Fukai et al.

FOREIGN PATENT DOCUMENTS

EP 1033525 A2 6/2000
EP 2886936 A1 6/2015
JP 2015-065150 A 4/2015

OTHER PUBLICATIONS

Chinese Office Action issued in Chinese Patent Application No. 201610551923.5 dated Jul. 13, 2018.

* cited by examiner

VEHICULAR LAMP

INCORPORATION BY REFERENCE

The disclosure of Japanese Patent Application No. 2015-141545 filed on Jul. 15, 2015 including the specification, drawings and abstract is incorporated herein by reference in its entirety.

BACKGROUND OF THE INVENTION

1. Field of the Invention

The invention relates to a vehicular lamp, and more particularly, to a vehicular lamp used in a vehicle such as an automobile.

2. Description of Related Art

Japanese Patent Application Publication No. 2015-65150 (JP 2015-65150 A) describes a vehicular lamp in which an organic electroluminescence element (organic EL element) is used as a light source.

The inventor considered mounting a plurality of the organic EL elements in the vehicular lamp described above and turning on each of them independently. In this case, the number of power supply wires increases, and therefore, it was recognized that this would lead to an increase in size of the vehicular lamp.

SUMMARY OF THE INVENTION

The invention provides technology that suppresses an increase in size of a vehicular lamp including a plurality of organic electroluminescence elements.

An aspect of the invention relates to a vehicular lamp. This vehicular lamp includes a plurality of organic electroluminescence elements; and a flexible printed circuit board to which the plurality of organic electroluminescence elements are connected, the flexible printed circuit board having lines through which each of the organic electroluminescence elements is supplied with electric power independently. According to this aspect, it is possible to suppress an increase in the size of the vehicular lamp.

In the aspect described above, at least two of the plurality of organic electroluminescence elements may be arranged such that light-emitting surfaces of adjacent organic electroluminescence elements among the at least two organic electroluminescence elements are not parallel to each other. According to this structure, visibility of the vehicular lamp can be improved. Also, the vehicular lamp according to the above-described aspect may include at least one pair of translucent members, wherein at least one of the plurality of organic electroluminescence elements may be sandwiched between each pair of the at least one pair of translucent members; and at least one of each pair of the at least one pair of translucent members may have a bent portion provided on a surface through which light from the at least one organic electroluminescence element passes. According to this structure, visibility of the vehicular lamp can be improved. Also, in the above-described aspect, each of the plurality of organic electroluminescence elements may have a first light-emitting surface and a second light-emitting surface that has lower luminance than the first light-emitting surface; and at least two of the plurality of organic electroluminescence elements may be arranged such that the second light-emitting surfaces face each other. According to this structure, the luminance of the vehicular lamp can be maintained no matter which of the overlaid organic electroluminescence elements is turned on.

According to the above-described aspect of the invention, it is possible to provide the technology that suppresses an increase in the size of the vehicular lamp including the plurality of organic electroluminescence elements.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

Figure 1A:
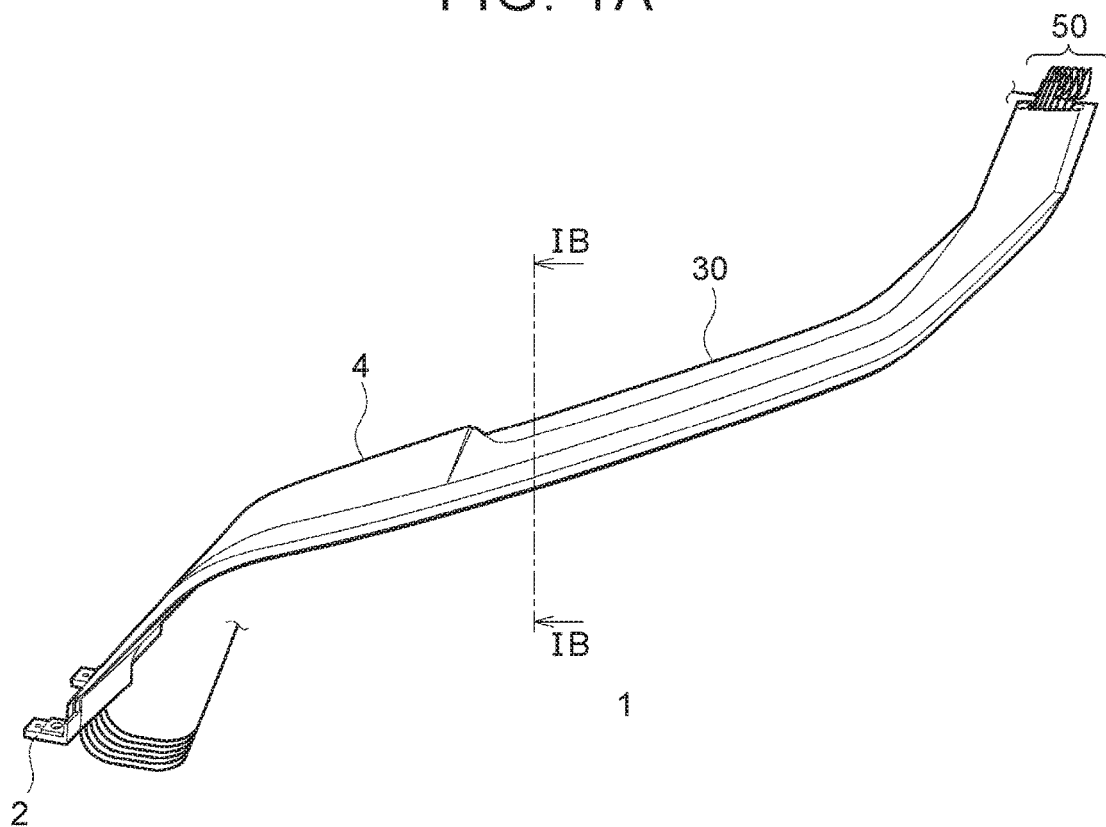
FIG. 1A is a perspective view of the external appearance of a vehicular lamp according to one example embodiment of the invention.

An example embodiment of the invention will be described with reference to the accompanying drawings. The same or equivalent constituent elements, members, and processes shown in the drawings will be denoted by the same reference characters, and redundant descriptions will be omitted as appropriate. Also, the example embodiment is only an example and is not intended to limit the invention.

Figure 1B:
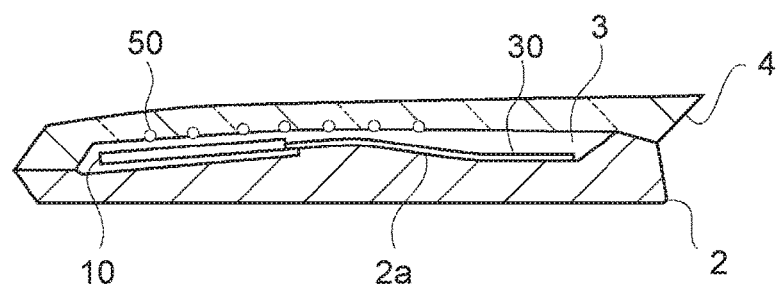
FIG. 1B is a sectional view taken along line IB-IB in FIG. 1A.
Figure 2:
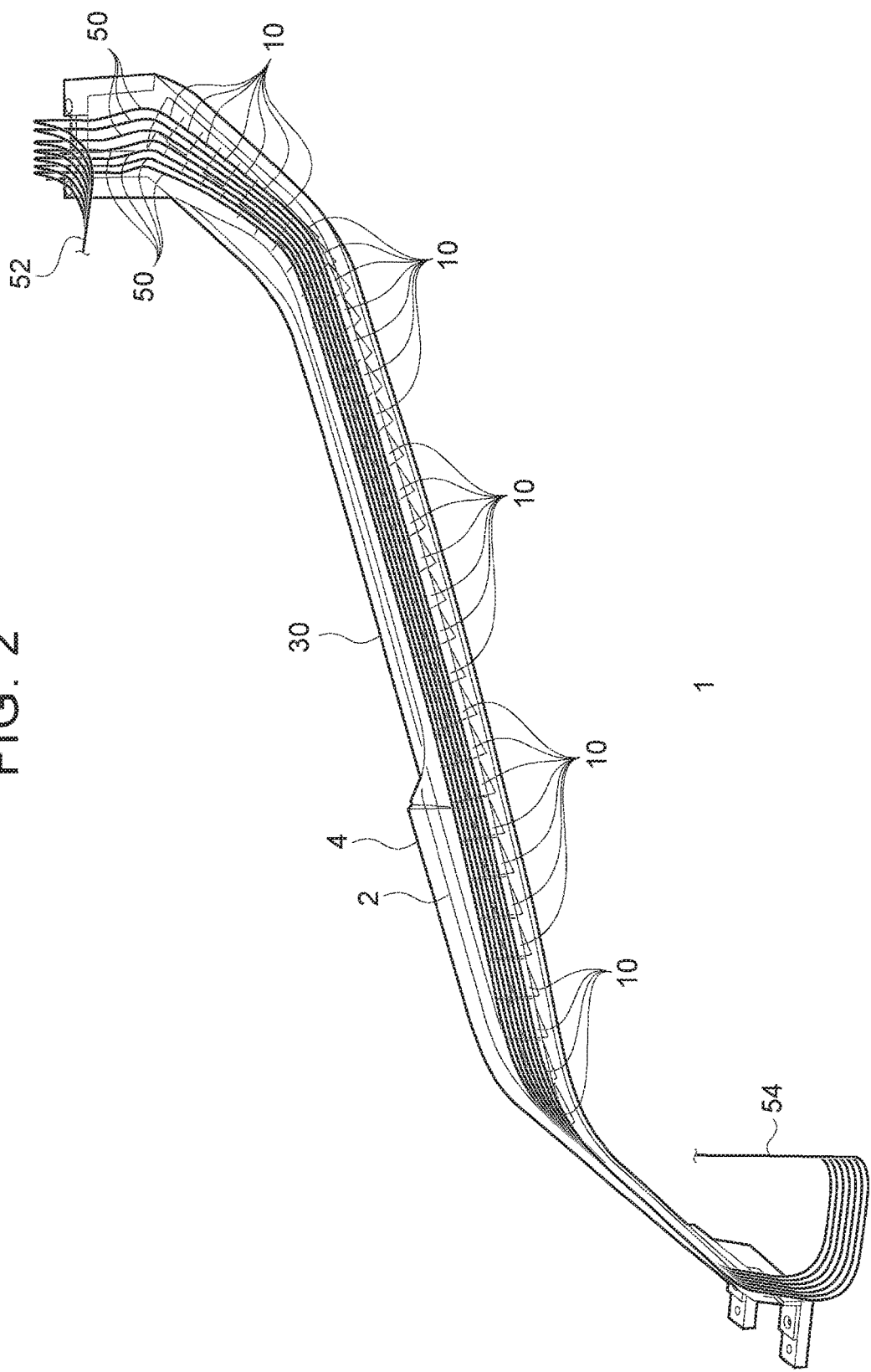
FIG. 2 is a perspective view of the internal structure of the vehicular lamp according to the example embodiment.

FIG. 1A is a perspective view of the external appearance of a vehicular lamp according to the example embodiment. FIG. 1B is a sectional view taken along line IB-IB in FIG. 1A. FIG. 2 is a perspective view of the internal structure of the vehicular lamp according to the example embodiment.

Normally, the internal structure of the vehicular lamp is visible from the outside because the translucent cover is substantially transparent. However, in FIG. 1A the internal structure is omitted for the sake of simplicity in order to make the external appearance and shape of the vehicular lamp clear.

A vehicular lamp 1 according to this example embodiment has a shape that is long in a vehicle width direction and short in a vertical direction, as an example. The vehicular lamp 1 includes a lamp body 2, and a translucent cover 4 that is attached to a lamp front side of the lamp body 2. The translucent cover 4 is made of resin or glass or the like that has translucency. The lamp body 2 and the translucent cover 4 form a lamp chamber 3. A plurality of organic electroluminescence elements (organic EL elements) 10, a flexible printed circuit board 30, and a plurality of optical fibers 50 are arranged inside the lamp chamber 3. The flexible printed circuit board 30 is fixed to a circuit board mounting surface 2a of the lamp body 2. The plurality of organic EL elements 10 are connected to the flexible printed circuit board 30, and fixed to the lamp body 2. The plurality of the organic EL elements 10 are arranged in the vehicle width direction.

The lamp body 2 is made of high thermal conductive material such as aluminum, for example. The organic EL elements 10 and the flexible printed circuit board 30 are adhered to the lamp body 2 with a thermally conductive adhesive or the like. Therefore, heat generated by the organic EL elements 10 is transferred to the lamp body 2 either directly, or via the flexible printed circuit board 30.

The postures of the plurality of optical fibers 50 are set to extend in the vehicle width direction, and the plurality of optical fibers 50 are fixed to a surface of the translucent cover 4 that faces the lamp body 2 side. The plurality of optical fibers 50 extend in parallel with one another, and are arranged in a vertical direction (up-down direction) of the vehicular lamp 1 in at least the center portion, in the vehicle width direction, of the vehicular lamp 1. One end portion 52 and the other end portion 54 of the plurality of optical fibers 50 are each bundled together and routed to the lamp rear side. A light source, not shown, is disposed near the end portion 52, and light from the light source enters the optical fibers 50 from the end portion 52, and is emitted from the end portion 54. A light source may be arranged near the end portion 54 instead of near the end portion 52, or light sources may be arranged both near the end portion 52 and near the end portion 54. The optical fibers 50 are configured such that light leaks out from side surfaces thereof. Since part of the incident light leaks out from the side surfaces of the optical fibers 50, the optical fibers 50 are visually recognized as light-emitting portions from the outside.

Figure 3:
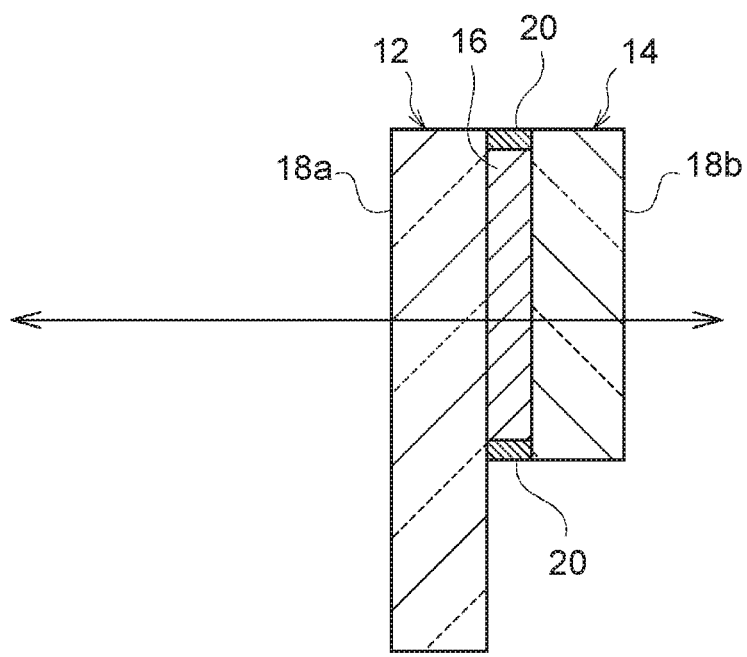
FIG. 3 is a sectional view schematically showing the structure of an organic EL element.
Figure 4:
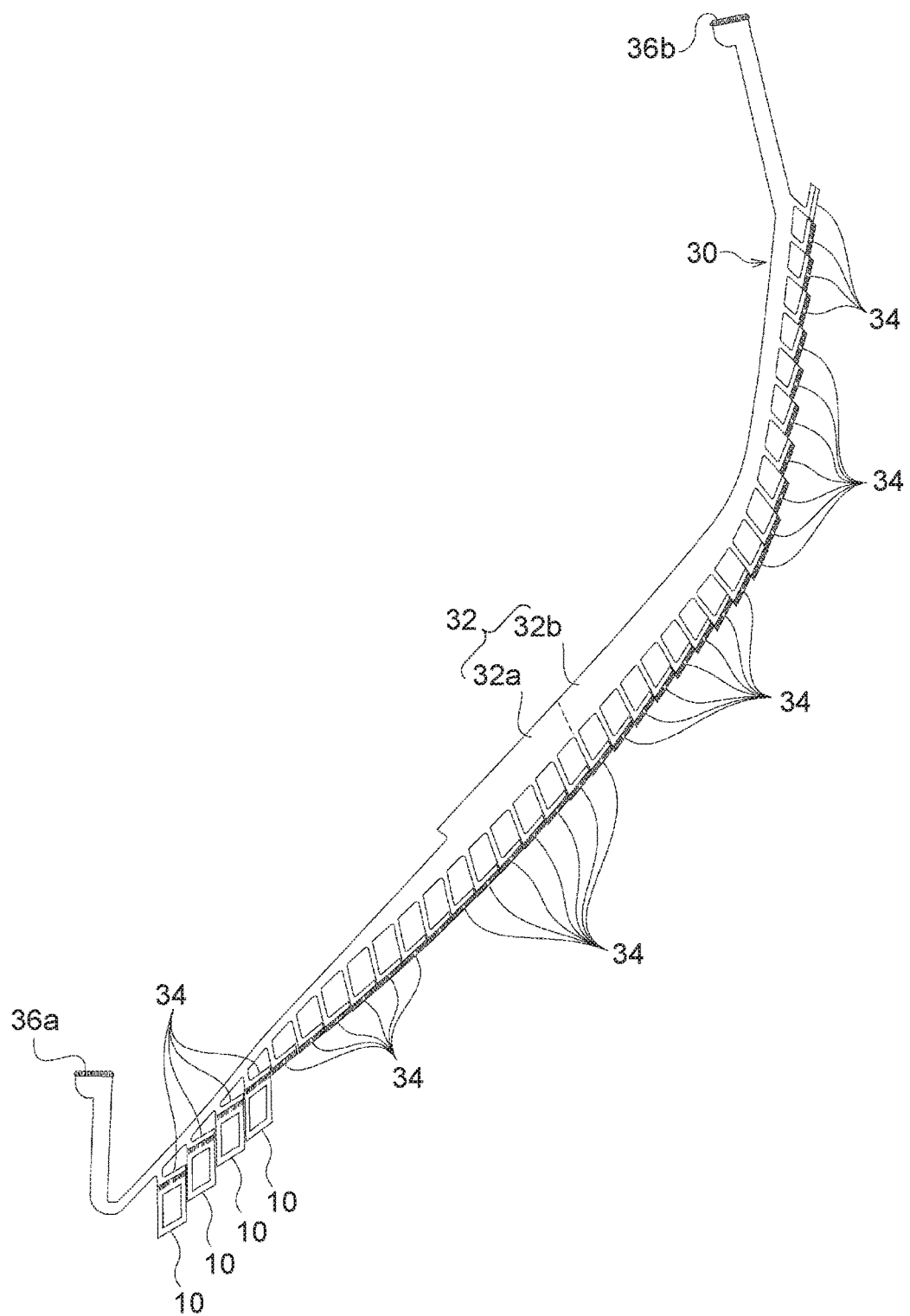
FIG. 4 is a plan view schematically showing the structure of the organic EL elements and a flexible printed circuit board.
Figure 5:
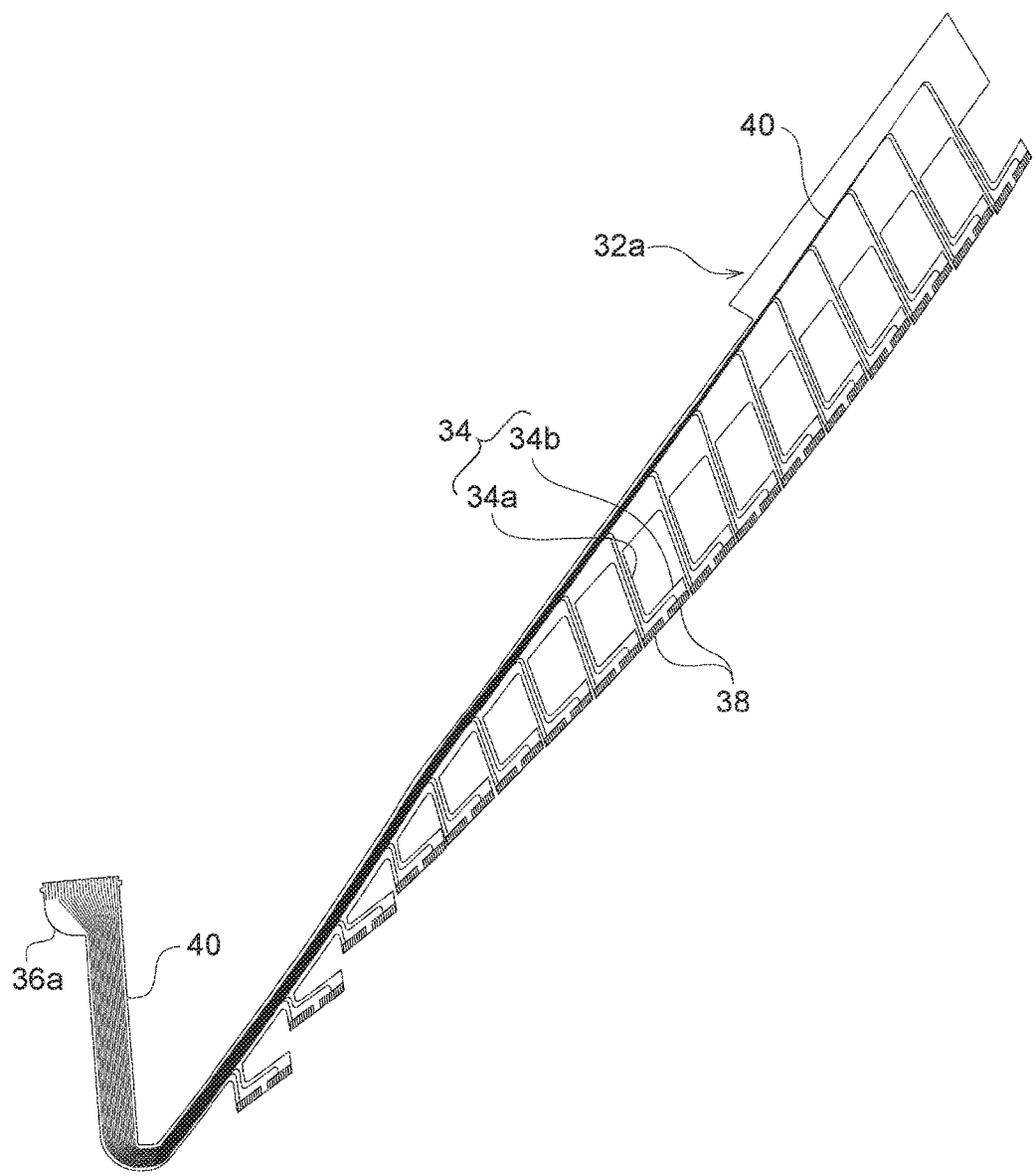
FIG. 5 is an enlarged view of a half of the flexible printed circuit board, which is positioned on the inside in a vehicle width direction.
Figure 6:
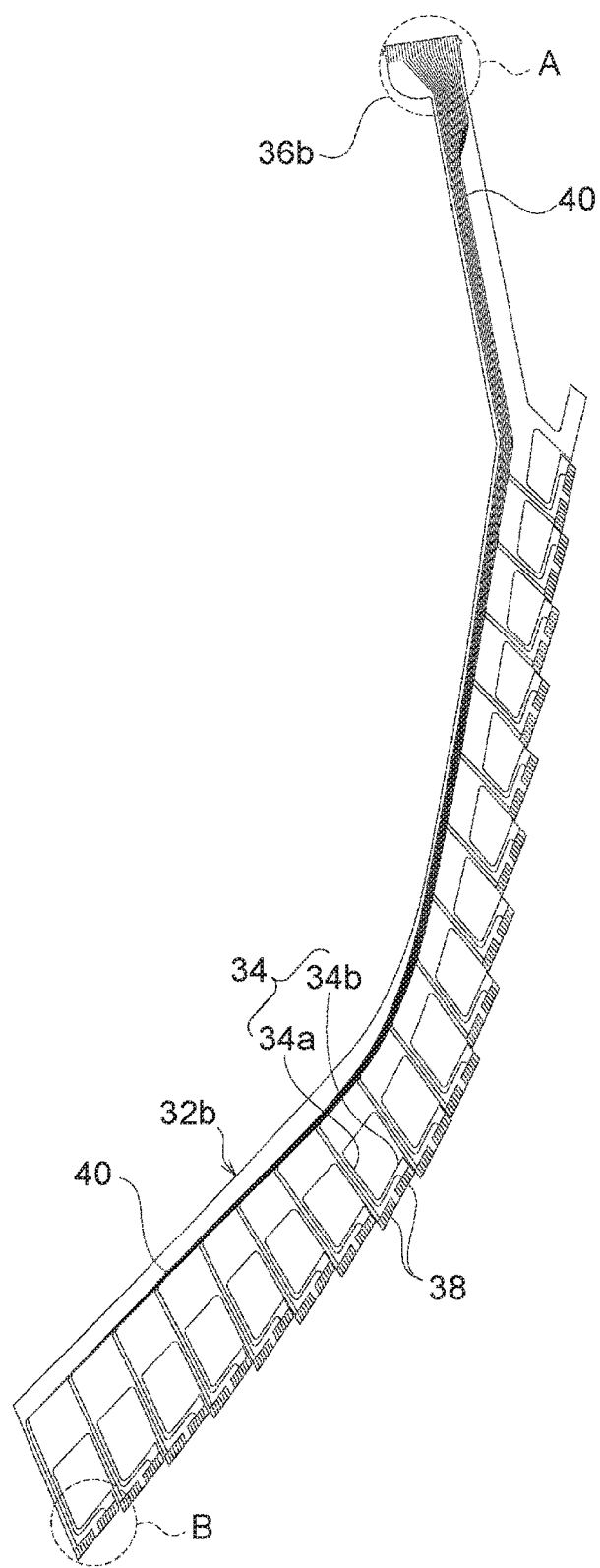
FIG. 6 is an enlarged view of a half of the flexible printed circuit board, which is positioned on the outside in the vehicle width direction.
Figure 7A:
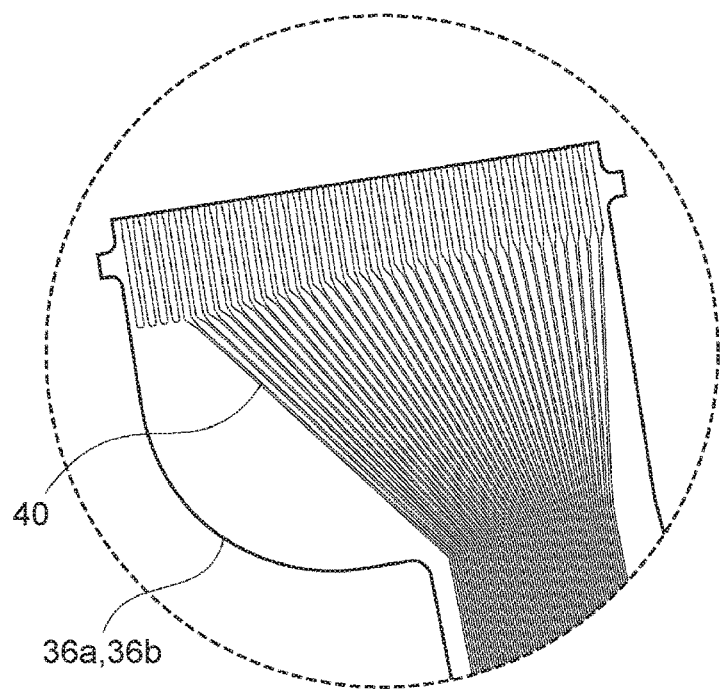
FIG. 7A is an enlarged view of a region A encircled by a broken line in FIG. 6.
Figure 7B:
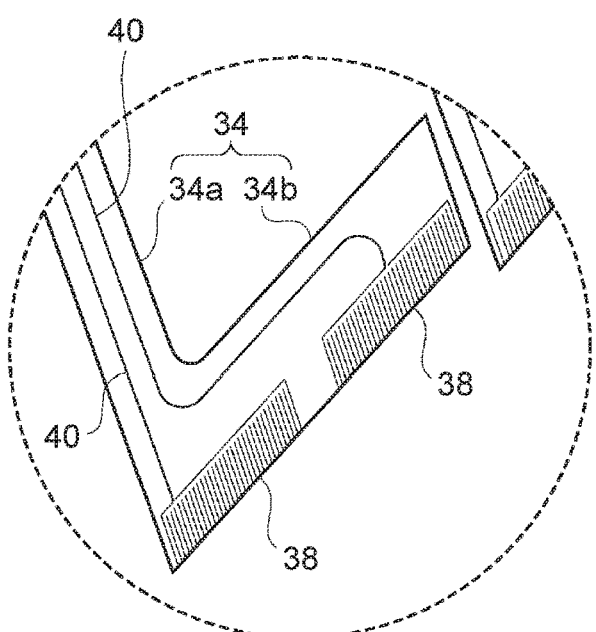
FIG. 7B is an enlarged view of a region B encircled by a broken line in FIG. 6.

Subsequently, the structures of the organic EL elements 10 and the flexible printed circuit board 30 will be described in detail. FIG. 3 is a sectional view schematically showing the structure of the organic EL elements 10. FIG. 4 is a plan view schematically showing the structure of the organic EL elements 10 and the flexible printed circuit board 30. FIG. 5 is an enlarged view of a half of the flexible printed circuit board 30, which is positioned on the inside in the vehicle width direction. FIG. 6 is an enlarged view of a half of the flexible printed circuit board 30, which is positioned on the outside in the vehicle width direction. FIG. 7A is an enlarged view of a region A encircled by a broken line in FIG. 6, and FIG. 7B is an enlarged view of a region B encircled by a broken line in FIG. 6.

Each of the organic EL elements 10 is a known organic EL element such as an organic light emitting diode (OLED), and has a structure in which a light-emitting portion 16 is sandwiched between a first surface glass substrate 12 and a second surface glass substrate 14. An adhesive layer 20 is provided on a side surface of the light-emitting portion 16, i.e., a surface that connects a surface contacting the first surface glass substrate 12 with a surface contacting the second surface glass substrate 14. Therefore, the light-emitting portion 16 is sealed by the first surface glass substrate 12, the second surface glass substrate 14, and the adhesive layer 20. The light-emitting portion 16 has a structure in which an anode layer, an organic light-emitting layer, and a cathode layer and the like are stacked together. The anode layer and the cathode layer are each formed by a transparent conductive film such as an indium tin oxide (ITO) film. The organic EL element 10 is substantially transparent, with a light transmission rate of approximately 40% at most at a wavelength of 380 to 780 nm, for example.

Each of the plurality of organic EL elements 10 has a first light-emitting surface 18a, and a second light-emitting surface 18b that has less luminance than the first light-emitting surface 18a. The first light-emitting surface 18a is positioned in the first surface glass substrate 12, and the second light-emitting surface 18b is positioned in the second surface glass substrate 14. That is, the organic EL element 10 emits more light from the first surface glass substrate 12-side than from the second surface glass substrate 14-side. The ratio between the luminance of the first light-emitting surface 18a and the luminance of the second light-emitting surface 18b is approximately 6:4, for example.

The flexible printed circuit board 30 is made of transparent material that is flexible and has insulation properties, such as polyimide. The flexible printed circuit board 30 has a light transmission rate of 80% or greater at a wavelength of 380 to 780 nm, for example. The flexible printed circuit board 30 includes a base portion 32 and a plurality of element connecting portions 34.

The base portion 32 has a substantially strip shape and extends in the vehicle width direction. The base portion 32 is divided in two at substantially the center in the vehicle width direction. That is, the base portion 32 includes an inside base portion 32a that is positioned on the inside in the vehicle width direction, and an outside base portion 32b that is positioned on the outside in the vehicle width direction. A connector fitting portion 36a is provided on an end portion on the inside in the vehicle width direction, of the inside base portion 32a. Also, a connector fitting portion 36b is provided on an end portion on the outside in the vehicle width direction, of the outside base portion 32b. The base portion 32 may also be one piece from the one end side to the other end side in the vehicle width direction.

The plurality of element connecting portions 34 are arranged in the extending direction of the base portion 32, and are each connected to the base portion 32. Each of the element connecting portions 34 is substantially L-shaped, and has a first portion 34a that extends branching off from the base portion 32, and a second portion 34b that extends in substantially parallel with the extending direction of the base portion 32, from the end portion of the first portion 34a on the opposite side from the base portion 32. A land 38 to which the organic EL element 10 is electrically connected is provided on the second portion 34b. The connector fitting portions 36a and 36b and the land 38 each have a structure in which a gold-plated layer is provided on a surface of conductive material such as copper foil, for example.

The flexible printed circuit board 30 has lines (traces) 40 through which each of the organic EL elements 10 is supplied with electric power independently. The lines 40 are made of conductive material such as copper foil. The lines 40 corresponding to each of the organic EL elements 10 extend along the surface of the base portion 32 from the connector fitting portion 36a or 36b to the element connecting portion 34. Then when the lines 40 reach the element connecting portion 34 to which the corresponding organic EL element 10 is connected, the lines 40 are connected to the land 38 via the first portion 34a and the second portion 34b of the element connecting portion 34. The lines 40 that extend from the connector fitting portion 36a are connected to the lands 38 provided on the inside base portion 32a. The lines 40 that extend from the connector fitting portion 36b are connected to the lands 38 provided on the outside base portion 32b.

Electrodes, not shown, of the organic EL elements 10 are electrically connected to the lands 38 of the element connecting portions 34. Therefore, each of the plurality of organic EL elements 10 is independently connected to a power supply. In this example embodiment, all of the organic EL elements 10 are each connected independently to the power supply, but the invention is not limited to this configuration. For example, some of the organic EL elements 10 may be connected in series or in parallel with each other to the power supply.

Figure 8A:
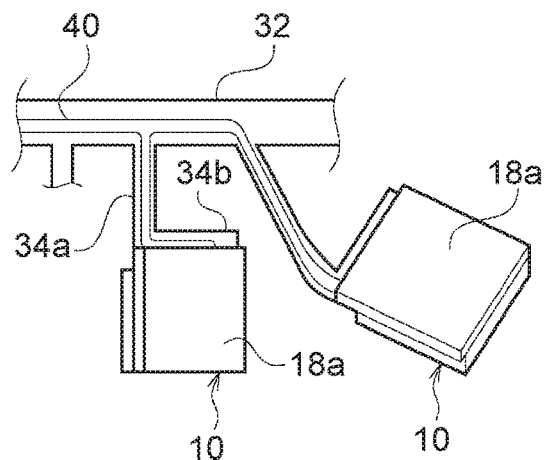
FIG. 8A is a schematic view illustrating mounting postures of the organic EL elements.
Figure 8B:
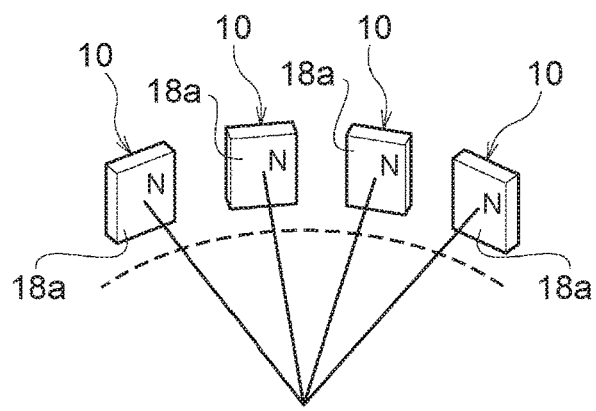
FIG. 8B is a schematic view illustrating mounting postures of the organic EL elements.
Figure 8C:
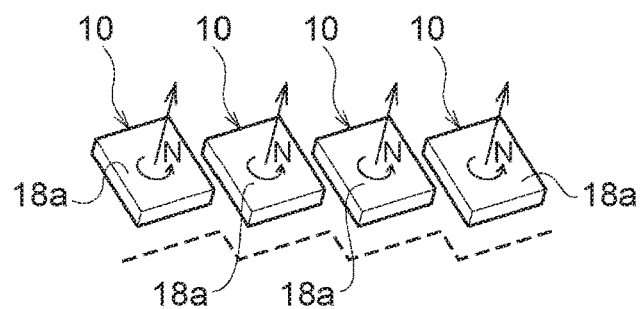
FIG. 8C is a schematic view illustrating mounting postures of the organic EL elements.

Subsequently, the mounting postures of the organic EL elements 10 mounted to the lamp body 2 will be described. FIGS. 8A to 8C are schematic views illustrating mounting postures of the organic EL elements 10. The flexible printed circuit board 30 is flexible. Therefore, the flexible printed circuit board 30 is able to easily deform to match the shape of the circuit board mounting surface 2a of the lamp body 2. Also, each of the element connecting portions 34 to which the organic EL elements 10 are connected includes the narrow strip-shaped first portion 34a that extends branching off from the base portion 32. Therefore, the positions (orientations) of the light-emitting surfaces 18 of the organic EL elements 10 can be easily changed.

Therefore, as shown in FIG. 8A, at least some (at least two) of the plurality of organic EL elements 10 can be arranged such that the light-emitting surfaces 18 of the adjacent organic EL elements 10 among the at least two organic EL elements 10 are not parallel to each other. That is, at least some (at least two) of the plurality of organic EL elements 10 may be arranged such that at least a portion of the first light-emitting surface 18a of one organic EL element 10 is not included in a plane that includes the first light-emitting surface 18a of another organic EL element 10. As one example of such an arrangement, the plurality of organic EL elements 10 are arranged such that normal lines N of the light-emitting surfaces 18 of the adjacent organic EL elements 10 intersect, as shown in FIG. 8B. Moreover, at least some of the plurality of organic EL elements 10 are arranged such that the normal lines N intersect at a point. That is, at least some of the plurality of organic EL elements 10 are arranged so as to form a substantially curved surface.

Also, as another example of the arrangement of the plurality of organic EL elements 10, at least some of the plurality of organic EL elements 10 are arranged in postures (positions) rotated around the normal lines N from a state in which two sides of the rectangular-shaped organic EL elements 10 extend horizontally and the other two sides extend in the vertical direction, as shown in FIG. 8C. That is, at least some of the plurality of organic EL elements 10 are arranged such that the outline of the upper sides or lower sides of the group of arranged organic EL elements (the broken line in FIG. 8C) form a stepped shape.

Figure 9A:
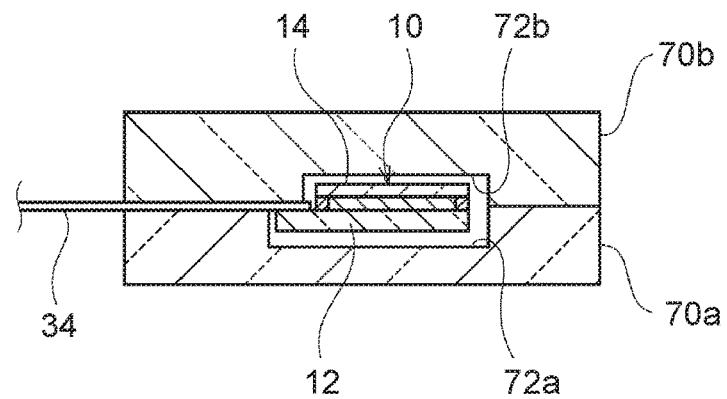
FIG. 9A is a schematic view illustrating a structure for fixing the organic EL element.
Figure 9B:
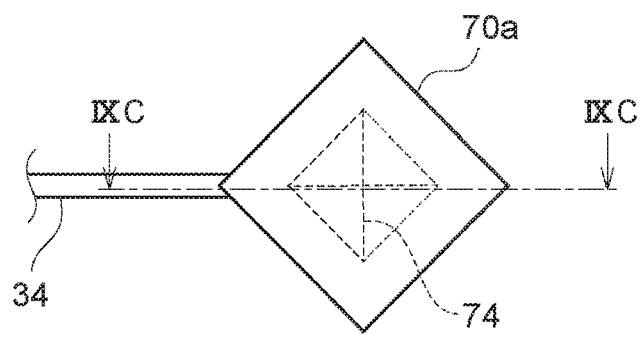
FIG. 9B is a schematic view illustrating another structure for fixing the organic EL element.
Figure 9C:
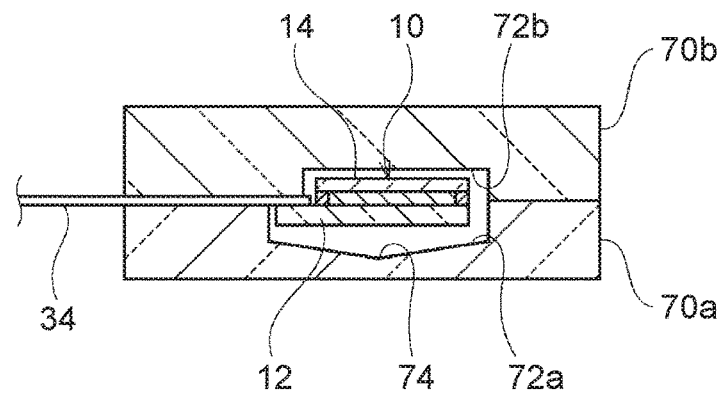
FIG. 9C is a sectional view taken along line IXC-IXC in FIG. 9B.

Subsequently, the structure for fixing the organic EL elements 10 will be described. FIGS. 9A to 9C are schematic views illustrating structures for fixing the organic EL elements 10. FIG. 9A is a sectional view of one example of a structure for fixing the organic EL elements 10. FIG. 9B is a front view of another example of a structure for fixing the organic EL elements 10, and FIG. 9C is a sectional view taken along line IXC-IXC in FIG. 9B.

As shown in FIG. 9A, the vehicular lamp 1 according to this example embodiment includes at least one pair of translucent members 70a and 70b, and at least one organic EL element 10 is sandwiched between each pair of the at least one pair of translucent members 70a and 70b. Each pair of translucent members 70a and 70b serves as the structure for fixing the at least one organic EL element 10. The translucent members 70a and 70b are made of transparent resin material such as acrylic or polycarbonate, for example. The translucent members 70a and 70b have a light transmission rate of 85% or greater at a wavelength of 380 to 780 nm, for example. When the translucent members 70a and 70b are made of acrylic resin, the light transmission rate in the wavelength range described above is approximately 94%. When the translucent members 70a and 70b are made of polycarbonate resin, the light transmission rate in the wavelength range described above is approximately 88%. The translucent member 70a is arranged on the side of the first surface glass substrate 12 of the organic EL element 10. The translucent member 70b is arranged on the side of the second surface glass substrate 14 of the organic EL element 10.

The translucent member 70a has a recessed portion 72a in a position corresponding to the organic EL element 10. The translucent member 70b has a recessed portion 72b in a position corresponding to the organic EL element 10. The organic EL element 10 is housed in a space formed by the recessed portion 72a and the recessed portion 72b when the translucent member 70a and the translucent member 70b are overlaid (i.e., the translucent member 70a and the translucent member 70b are fitted to each other). The organic EL element 10 may be arranged such that the first light-emitting surface 18a closely contacts a bottom surface of the recessed portion 72a, and the second light-emitting surface 18b closely contacts a bottom surface of the recessed portion 72b, or a gap may be provided between the light-emitting surface and the bottom surface and a transparent adhesive or the like may be filled into this gap.

The translucent members 70a and 70b may each have a bent portion on a surface through which the light from the organic EL element 10 passes. For example, the translucent member 70a arranged on the side of the first surface glass substrate 12 may have a bent portion 74, as shown in FIGS. 9B and 9C. More specifically, the bent portion 74 is provided on a surface of the recessed portion 72a of the translucent member 70a that faces the first surface glass substrate 12, i.e., on the bottom surface of the recessed portion 72a. The bent portion refers to a boundary portion of two flat surfaces or curved surfaces that are inclined in different directions, for example. The bent portion is a valley line area or a ridge line area, for example. Also, the bent portion is a curved surface having a smaller curvature radius than that of two flat surfaces or curved surfaces that form the bent portion, for example.

The bent portion 74 may be provided on an outside surface of the translucent member 70a, i.e., a surface that faces the opposite side from the translucent member 70b. Also, the bent portion 74 may be provided on the translucent member 70b. Also, a pair of the translucent members 70a and 70b may be provided for each organic EL element 10, or some (a plurality) or all of the organic EL elements 10 may be fixed by the same translucent members 70a and 70b. Further, the flexible printed circuit board 30 may be fixed and sandwiched between the translucent members 70a and 70b.

Figure 10A:
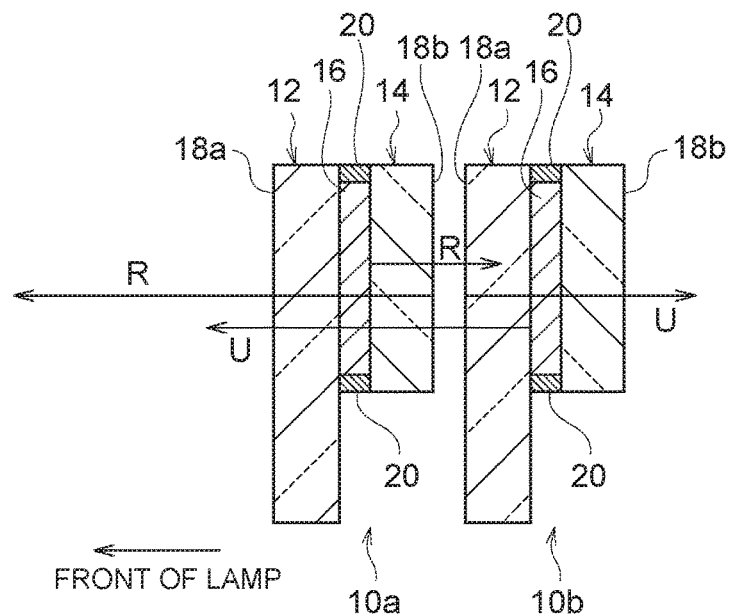
FIG. 10A is a schematic view illustrating an overlaid arrangement of the organic EL elements according to a comparative example.
Figure 10B:
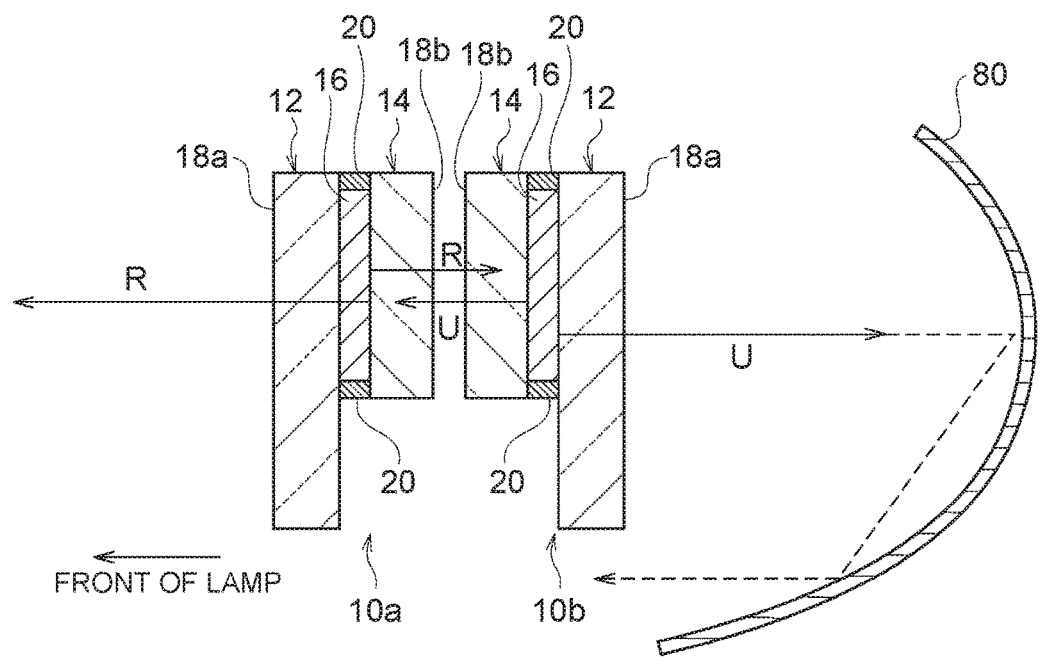
FIG. 10B is a schematic view illustrating an overlaid arrangement of the organic EL elements according to the example embodiment.

Subsequently, the overlaid arrangement of the organic EL elements 10 will be described. FIGS. 10A and 10B are schematic views illustrating overlaid arrangements of the organic EL elements 10, with FIG. 10A showing an overlaid arrangement according to a comparative example, and FIG. 10B showing an overlaid arrangement according to this example embodiment.

As described above, the flexible printed circuit board 30 can be easily deformed. Therefore, the plurality of organic EL elements 10 may be arranged such that the first light-emitting surfaces 18a of the plurality of organic EL elements 10 are overlaid when viewed from the front of the lamp. For example, when two of the organic EL elements 10 are overlaid, a lamp that serves as a tail lamp and a turn signal lamp can be realized by providing one organic EL element 10a as an element that emits red light and providing the other organic EL element 10b as an element that emits amber light. That is, the vehicular lamp 1 may be used as a plurality of kinds of lamps.

When two of the organic EL elements 10 are overlaid, the organic EL element 10a and the organic EL element 10b may conceivably be arranged such that the first surface glass substrate 12 of each of the organic EL elements 10a and 10b faces the front side of the lamp, as shown in FIG. 10A. That is, the organic EL elements 10a and 10b may be arranged such that the second light-emitting surface 18b of the organic EL element 10a and the first light-emitting surface 18a of the organic EL element 10b face each other.

As described above, the first light-emitting surface 18a of the organic EL element 10 has a higher luminance than the second light-emitting surface 18b of the organic EL element 10. Therefore, red light R is mainly emitted toward the front of the lamp from the first light-emitting surface 18a of the organic EL element 10a. Amber light U is mainly emitted toward the front of the lamp from the first light-emitting surface 18a of the organic EL element 10b. Because there are no other organic EL elements 10 in front of the organic EL element 10a in the lamp, the red light R emitted from the first light-emitting surface 18a can be emitted toward the front of the lamp while retaining its luminance.

On the other hand, the organic EL element 10a is in front of the organic EL element 10b in the lamp. Therefore, the amber light U emitted from the first light-emitting surface 18a of the organic EL element 10b is emitted toward the front of the lamp after passing through the organic EL element 10a. Thus, the amber light U ends up attenuating before it is emitted toward the front of the lamp. As a result, with the overlaid arrangement shown in FIG. 10A, the vehicular lamp appears bright when the red light R is emitted, but the vehicular lamp appears dark when the amber light U is emitted.

In contrast, with the example embodiment, the organic EL element 10a and the organic EL element 10b are arranged such that their second light-emitting surfaces 18b face each other, as shown in FIG. 10B. That is, at least two of the plurality of organic EL elements 10 are arranged such that the second light-emitting surfaces 18b face each other. With this arrangement, the red light R emitted from the first light-emitting surface 18a of the organic EL element 10a is emitted toward the front of the lamp without passing through the other organic EL element 10. Also, the amber light U emitted from the first light-emitting surface 18a of the organic EL element 10b is emitted toward the lamp rear side without passing through the other organic EL element 10.

By arranging a reflector 80 on the lamp rear side of the organic EL element 10b (i.e., by arranging the reflector 80 behind the organic EL element 10b in the lamp), the amber light U emitted from the first light-emitting surface 18a can be reflected toward the lamp front side. As a result, the amber light U emitted from the first light-emitting surface 18a can be emitted toward the front of the lamp without passing through the other organic EL element 10. As a result, the vehicular lamp 1 appears bright both when the red light R is being emitted and when the amber light U is being emitted.

The same is true when the organic EL element 10a is an element that emits amber light and the organic EL element 10b is an element that emits red light. Also, with the overlaid arrangement of the organic EL elements 10 shown in FIG. 10A, when the reflector 80 is arranged on the lamp rear side of the organic EL element 10b, the amber light U reflected toward the front of the lamp by the reflector 80 is light of a low luminance that is emitted from the second light-emitting surface 18b. Therefore, with the overlaid arrangement shown in FIG. 10A, the amber light U ends up appearing darker than the red light R, even if the reflector 80 is provided.

Further, even with a configuration in which the red light R is emitted to one side of the vehicular lamp 1 and the amber light U is emitted to the opposite side of the vehicular lamp 1, instead of a configuration in which the red light R and the amber light U are both emitted in the same direction, the overlaid arrangement of this example embodiment enables both the luminance of the red light and the luminance of the amber light U to be ensured.

In the vehicular lamp 1 according to this example embodiment, it is possible to sequentially turn on the plurality of organic EL elements 10 and to sequentially turn off the plurality of organic EL elements 10. That is, in the vehicular lamp 1, the plurality of organic EL elements 10 can be sequentially turned on or off one by one, or groups of successive organic EL elements 10 can be sequentially turned on or off one group after another. Alternatively, it is possible to sequentially turn on or off the plurality of organic EL elements 10 one by one in combination with sequentially turning on or off groups of successive organic EL elements 10 one group after another. For example, in the vehicular lamp 1, it is possible to sequentially turn on the organic EL elements 10 in order from the inside in the vehicle width direction toward the outside in the vehicle width direction, or in the opposite direction.

Also, in the vehicular lamp 1, it is possible to sequentially turn on the plurality of optical fibers 50, and to sequentially turn off the plurality of optical fibers 50.

That is, in the vehicular lamp 1, the plurality of optical fibers 50 can be sequentially turned on or off one by one, or groups of successive optical fibers 50 can be sequentially turned on or off one group after another. Alternatively, it is possible to sequentially turn on or off the plurality of optical fibers 50 one by one in combination with sequentially turning on or off groups of successive optical fibers 50 one group after another. For example, in the vehicular lamp 1, it is possible to sequentially turn on the optical fibers 50 in order starting from the optical fiber 50 located at a low position in the lamp in the center in the vehicle width direction of the vehicular lamp 1. Moreover, in the vehicular lamp 1, it is possible to sequentially turn on the plurality of organic EL elements 10 and to sequentially turn off the plurality of organic EL elements 10, in combination with sequentially turning on the plurality of optical fibers 50 and sequentially turning off the plurality of optical fibers 50. Also, the brightness of the optical fibers 50 can be changed by changing the current value supplied to the light source arranged near the end portion 52 and/or the end portion 54.

The vehicular lamp 1 according to this example embodiment may be used as a marker lamp such as a turn signal lamp, a daytime running lamp, or a clearance lamp, or as a headlamp, a tail lamp, or a brake lamp, for example.

As described above, the vehicular lamp 1 according to this example embodiment includes the plurality of organic EL elements 10, and the flexible printed circuit board 30 to which the plurality of organic EL elements 10 are connected, the flexible printed circuit board 30 having the lines 40 through which each of the organic EL elements 10 is supplied with electric power independently. Lines need to be provided for each of the organic EL elements 10 in order to cause each of the plurality of organic EL elements 10 to emit light individually. Therefore, the number of lines may increase, which may lead to an increase in the size of the vehicular lamp. On the other hand, the vehicular lamp 1 according to this example embodiment includes the flexible printed circuit board 30 with the patterned lines 40. With the flexible printed circuit board 30, each of the lines 40 can be made thin. Therefore, it is possible to suppress an increase in the size of the vehicular lamp 1.

Also, the organic EL elements 10 and the flexible printed circuit board 30 are substantially transparent. In addition, each of the lines 40 is thin and thus is not easily visually recognized from the outside. Therefore, the appearance, or design of the vehicular lamp 1 can be improved. Also, the lines 40 are printed onto the flexible printed circuit board 30, which makes it possible to avoid a situation in which the inside of the lamp becomes cluttered due to multiple lines. As a result, the manufacturing process of the vehicular lamp 1 can be simplified, and work efficiency (efficiency in manufacturing) can be improved. Also, the flexible printed circuit board 30 is flexible. Therefore, the degree of freedom (flexibility) in design of the vehicular lamp 1 can be improved.

Further, in the vehicular lamp 1 according to this example embodiment, at least some (at least two) of the plurality of organic EL elements 10 are arranged such that the light-emitting surfaces of the adjacent organic EL elements 10 among the at least two organic EL elements 10 are not parallel to each other. As described above, the flexible printed circuit board 30 is flexible. Therefore, the postures of the organic EL elements 10 can be easily changed. As a result, the plurality of organic EL elements 10 can be arranged three-dimensionally. Therefore, the visibility or design of the vehicular lamp 1 can be improved.

Also, the vehicular lamp 1 includes the pair of translucent members 70a and 70b that sandwich the organic EL element 10. The organic EL element 10 is fixed by being sandwiched between the pair of translucent members 70a and 70b. As a result, the organic EL element 10 can be stably retained. Also, at least one of the pair of translucent members 70a and 70b has the bent portion 74 on a surface through which light from the organic EL element 10 passes. That is, at least one of the translucent members 70a and 70b has a step-shaped surface. Therefore, the light-emitting portion of the vehicular lamp 1 appears three-dimensional. Thus, the visibility or design of the vehicular lamp 1 can be improved.

Also, in the vehicular lamp 1, each of the plurality of organic EL elements 10 has the first light-emitting surface 18a of a relatively high luminance and the second light-emitting surface 18b of a relatively low luminance. Also, at least two of the plurality of organic EL elements 10 are arranged such that the second light-emitting surfaces 18b face each other. The size of the vehicular lamp 1 can be reduced, or the number of organic EL elements 10 that are provided can be increased by overlaying the plurality of organic EL elements 10.

Moreover, by arranging the second light-emitting surfaces 18b of the organic EL elements 10 so that they face each other, in a laminated body composed of two organic EL elements 10, the first light-emitting surfaces 18a of both of the organic EL elements 10 face the outside of the laminated body. As a result, the luminance of the vehicular lamp 1 can be maintained no matter which of the organic EL elements 10 is caused to emit light. Even in a structure in which two of the organic EL elements 10 are overlaid to face in the same direction, the luminance of the vehicular lamp 1 can be maintained by increasing the current supplied to the organic EL element 10 with the first light-emitting surface 18a that is facing the inside of the laminated body. However, in this case, the life of the organic EL element 10 to which increased current is supplied will end up being shorter. On the other hand, with this example embodiment, shortening of the life of the organic EL element 10 can be avoided.

Also, since the thin organic EL elements 10 are overlaid, the plurality of the organic EL elements 10 appear as a single light-emitting portion. Further, when the plurality of organic EL elements 10 are sandwiched between the pair of translucent members 70a and 70b, the plurality of organic EL elements 10 tend to appear even more like a single light-emitting portion. Also, when the colors of light emitted from the overlaid organic EL elements 10 are made different, the light emitted from the overlaid organic EL elements 10 looks like light of a plurality of colors emitted from a single light-emitting source. As a result, the design of the vehicular lamp 1 can be improved. Although it is possible to emit light of a plurality of colors with a single organic EL element 10, in this case, the structure of the organic EL element 10 would be complex and the cost of the organic EL element 10 would also increase. In contrast, with this example embodiment, it is possible to prevent the structure of the organic EL element 10 from becoming complex and the cost from increasing.

The invention is not limited to the example embodiment described above. To the contrary, various modifications such as design changes may also be added based on the knowledge of one skilled in the art, and example embodiments to which such modifications have been added are also included in the scope of the invention. Example embodiments resulting from modifications being added to the example embodiment described above have the effects of both the combined example embodiment and the modifications.

What is claimed is:
1. A vehicular lamp comprising:
   a plurality of organic electroluminescence elements; and
   a flexible printed circuit board including a base portion and a plurality of element connecting portions to which the plurality of organic electroluminescence elements are connected, the flexible printed circuit board having lines through which each of the organic electroluminescence elements is supplied with electric power independently,
   wherein each of the plurality of organic electroluminescence elements is connected to the flexible printed circuit board via a corresponding one of the element connecting portions, and each of the element connecting portions includes a strip-shaped first portion that extends branching off from the base portion.

2. The vehicular lamp according to claim 1, wherein at least two of the plurality of organic electroluminescence elements are arranged such that light-emitting surfaces of adjacent organic electroluminescence elements among the at least two organic electroluminescence elements are not parallel to each other.

3. The vehicular lamp according to claim 1, further comprising:
at least one pair of translucent members, wherein:
at least one of the plurality of organic electroluminescence elements is sandwiched between each pair of the at least one pair of translucent members; and
at least one of each pair of the at least one pair of translucent members has a bent portion provided on a surface through which light from the at least one organic electroluminescence element passes.

4. The vehicular lamp according to claim 1, wherein:
each of the plurality of organic electroluminescence elements has a first light-emitting surface and a second light-emitting surface that has lower luminance than the first light-emitting surface; and
at least two of the plurality of organic electroluminescence elements are arranged such that the second light-emitting surfaces face each other.

5. The vehicular lamp according to claim 1, further comprising:
a pair of translucent members, wherein:
an organic electroluminescence element from among the plurality of organic electroluminescence elements is sandwiched between the pair of translucent members; and
one of the translucent members has a bent portion provided on a surface through which light from the organic electroluminescence element passes.

6. The vehicular lamp according to claim 1, further comprising a plurality of optical fibers that are configured to emit light, wherein the optical fibers extend in parallel with each other.

7. The vehicular lamp according to claim 6, wherein the optical fibers extend over the plurality of organic electroluminescence elements.

* * * * *